(12) United States Patent
Ardalan

(10) Patent No.: US 9,685,976 B2
(45) Date of Patent: Jun. 20, 2017

(54) METHODS AND DEVICES FOR MODIFYING ACTIVE PATHS IN A K-DELTA-1-SIGMA MODULATOR

(71) Applicant: Micro RDC, Colorado Springs, CO (US)

(72) Inventor: Sasan Ardalan, Alberquerque, NM (US)

(73) Assignee: MICROELECTRONICS RESEARCH & DEVELOPMENT CORP., Colorado Springs, CO (US)

( * ) Notice: Subject to any disclaimer, the term of this patent is extended or adjusted under 35 U.S.C. 154(b) by 0 days.

(21) Appl. No.: 14/747,699

(22) Filed: Jun. 23, 2015

(65) Prior Publication Data

US 2017/0070237 A1   Mar. 9, 2017

(51) Int. Cl.
*H03M 3/00* (2006.01)

(52) U.S. Cl.
CPC .............. *H03M 3/496* (2013.01); *H03M 3/42* (2013.01); *H03M 3/454* (2013.01)

(58) Field of Classification Search
CPC ......... H03M 3/496; H03M 3/42; H03M 1/124
USPC ........ 341/143, 118, 120, 122, 172, 155, 144
See application file for complete search history.

(56) References Cited

U.S. PATENT DOCUMENTS

| 7,564,391 | B2 | 7/2009 | Das |
| 7,619,550 | B2 | 11/2009 | Maeda |
| 7,916,054 | B2 * | 3/2011 | Baker ............. H03M 3/47 341/118 |
| 9,276,602 | B1 * | 3/2016 | Pagnanelli ........... H03M 3/358 |

OTHER PUBLICATIONS

Gomac, Richard L. Chaney, On-Shore 45nm Bulk CMOS with Reduced Mask Costs, Mar. 2012, pp. 1-4, http://www.americansemi.com/papers.html.
Intel Technology Journal, vol. 12, Lin Chao, Intel's 45nm CMOS Technology, Jun. 17, 2008, pp. 1-90.
IEEE International Workshop on High-Performance Chip, Package and Systems, Bio for R. Jacob Baker, Nov. 8, 2014, pp. 1-2.

(Continued)

*Primary Examiner* — Peguy Jean Pierre
(74) *Attorney, Agent, or Firm* — Todd L. Juneau; Juneau & Mitchell

(57) ABSTRACT

The invention relates to an improved K-Delta-1-Sigma Modulators (KG1Ss) that achieve multi GHz sampling rates with 90 nm and 45 nm CMOS processes, and that provide the capability to balance performance with power in many applications. The improved KD1Ss activate all paths when high performance is needed (e.g. high bandwidth), and reduce the effective bandwidth by shutting down multiple paths when low performance is required. The improved KD1Ss can adjust the baseband filtering for lower bandwidth, and can provide large savings in power consumption while maintaining the communication link, which is a great advantage in space communications. The improved KD1Ss herein provides a receiver that adjusts to accommodate a higher rate when a packet is received at a low bandwidth, and at a initial lower rate, power is saved by turning off paths in the KD1S Analog to Digital Converter, and where when a higher rate is required, multiple paths are enabled in the KD1S to accommodate the higher band widths.

11 Claims, 9 Drawing Sheets

(56) References Cited

OTHER PUBLICATIONS

IEEE SSCS, R. Jacob Baker, K-Delta-1-Sigma Analog-to-Digital Converters for High-Speed Data Communications, Nov. 7, 2014, pp. 1-39.
The International Technology Roadmap for Semiconductors: 2011 Edition Executive Summary, 2011, pp. 1-110.
Boise State University Graduate College, Vishal Saxena, Dissertation Title: K-Delta-1-Sigma Modulators for Wideband Analog-to-Digital Conversion, May 2010, pp. 1-255.
R. Jacob Baker, A K-Delta-1-Sigma Modulator for Wideband Analog-to-Digital Conversion, pp. 1-29, CMOSedu.comcmosedu.com/jbaker/papers/talks.
Analog Devices, Inc., Walt Kester, MT-002 Tutorial: What the Nyquist Criterion Means to Your Sampled Data System Design, Oct. 2008, pp. 1-12.
Analog Devices, Inc., Walt Kester, MT-001 Tutorial: Taking the Mystery out of the Infamous Formula, "SNR=6.02N+1.76dB," and Why You Should Care, Oct. 2008, pp. 1-7.
Analog Devices, Inc., Walt Kester, MT-022 Tutorial: ADC Architectures III: Sigma-Delta ADC Basics, Oct. 2008, pp. 1-12.
PhysLink.com, Physics & Astronomy Online, Kevin Frye, M.S., Geophysics grad student, MIT, What is aliasing? When it Occurs?, Jun. 18, 2015, pp. 1-4.

\* cited by examiner

Figure 1 Delta Sigma Modulation

Figure 2 Switched Capacitor 1st Order DSM

Figure 3 Switched Capacitor 1st Order DSM Spectrum (frequency in samples, max fs/2)

Figure 4 Time-interleaved ADCs and the corresponding clock phases.
(Courtesy of Saxena)

Figure 5 The K-Delta-1-Sigma modulator topology
(Courtesy of Saxena)

Figure 6 Fully differential CMOS implementation of a second-order Delta Sigma modulator (Courtesy of Brandt)

METHODS AND DEVICES FOR MODIFYING ACTIVE PATHS IN A K-DELTA-1-SIGMA MODULATOR

FEDERALLY SPONSORED RESEARCH OR DEVELOPMENT

This invention was made with government support under NASA contract number NNX11CE01P. The U.S. government has certain rights in the invention.

CROSS REFERENCE TO RELATED APPLICATIONS

This application claims the benefit of the provisional application entitled Delta Sigma Modulator and Method filed Jun. 23, 2014 having U.S. Ser. No. 62/015,619, the contents of which are incorporated herein in their entirety.

JOINT RESEARCH AGREEMENT

Not applicable

SEQUENCE LISTING

Not applicable

FIELD OF THE INVENTION

The present invention relates to the field of mixed-signal analog and digital design, and in particular to topologies for analog-to-digital conversion and to delta-sigma modulators, also referred to as sigma-delta modulators, using poly-phase sampling sometimes called N-path sampling or time-interleaved sampling.

BACKGROUND

Analog-to-digital converters, or ADCs, convert real world signals such as audio and video to digital signals where they can be processed by digital processors, Speed, power consumption, cost and noise are all considerations in the design of analog-to-digital converters.

Delta-sigma ($\Delta\Sigma$; or sigma-delta, $\Sigma\Delta$) modulation is a digital signal processing, or DSP, method for encoding analog signals into digital signals as found in an ADC. It is also used to transfer higher-resolution digital signals into lower-resolution digital signals as part of the process to convert digital signals into analog.

According to Kester, Delta modulation was first invented at ITT laboratories in France in 1946 by E. M. Deloraine, S. Van Mierlo, and B. Derjavitch. C. C. Cutler of Bell Telephone Labs filed a patent on differential pulse code modulation (PCM) in 1950.

In a conventional ADC, an analog signal is integrated, or sampled, with a sampling frequency and subsequently quantized in a multi-level quantizer into a digital signal. This process introduces quantization error noise. Delta modulation and differential PCM was directed to achieving higher transmission efficiency by transmitting only the changes, the delta, in value between consecutive samples.

The first step in a delta-sigma modulation is delta modulation. In delta modulation the change in the signal (its delta) is encoded, rather than the absolute value. The result is a stream of pulses, as opposed to a stream of numbers as is the case with PCM. In delta-sigma modulation, the accuracy of the modulation is improved by passing the digital output through a 1-bit DAC and adding (sigma) the resulting analog signal to the input signal, thereby reducing the error introduced by the delta-modulation.

In 1962, Inose, Yasuda, and Murakami used solid state circuits and elaborated on the single-bit oversampling noise-shaping architecture proposed by Cutler in 1954. All the work described thus far was related to transmitting an oversampled digitized signal directly rather than the implementation of a Nyquist analog to digital converter (ADC). In 1969 D. J. Goodman at Bell Labs described a true Nyquist Sigma-Delta ($\Sigma$-$\Delta$) ADC with a digital filter and a decimator following the modulator. In 1974 J. C. Candy, also of Bell Labs, described a multibit oversampling $\Sigma$-$\Delta$ ADC with noise shaping, digital filtering, and decimation to achieve a high resolution Nyquist ADC. The IC $\Sigma$-$\Delta$ ADC offers several advantages over the other architectures, especially for high resolution, low frequency applications. First and foremost, the single-bit $\Sigma$-$\Delta$ ADC is inherently monotonic and requires no laser trimming. The $\Sigma$-$\Delta$ ADC also lends itself to low cost foundry CMOS processes because of the digitally intensive nature of the architecture.

Modern CMOS $\Sigma$-$\Delta$ ADCs (and DACs, for that matter) are the converters of choice for voiceband and audio applications. The highly digital architectures lend themselves nicely to fine-line CMOS. In addition, high resolution (up to 24 bits) low frequency $\Sigma$-$\Delta$ ADCs have virtually replaced the older integrating converters in precision industrial measurement applications. Accordingly, this technique has found increasing use in modern electronic components such as converters, frequency synthesizers, switched-mode power supplies and motor controllers, primarily because of its cost efficiency and reduced circuit complexity.[1]

Although there have been additional improvements in the field of $\Sigma$-$\Delta$ ADCs, there is still a need for improved $\Sigma$-$\Delta$ ADC technology, especially K-Delta-1-Sigma Modulators (KG1Ss) that achieve multi GHz sampling rates with 90 nm and 45 nm CMOS processes, and that provide the capability to balance performance with power in many applications.

Additionally, there is a need for KD1Ss that activate all paths when high performance is needed (e.g. high bandwidth), and that reduce the effective bandwidth by shutting down multiple paths when low performance is required.

Further, the remains a need for KD1Ss that can adjust the baseband filtering for lower bandwidth.

And further still, there is a need for KD1Ss that can provide large savings in power consumption while maintaining the communication link, which is a great advantage in space communications.

Additionally, there is a need for KD1Ss where the receiver adjusts to accommodate a higher rate when a packet is received at a low bandwidth, where at a initial lower rate, power is saved by turning off paths in the KD1S Analog to Digital Converter, and where when a higher rate is required, multiple paths are enabled in the KD1S to accommodate the higher band widths.

SUMMARY

Provided herein is an improved K-Delta-1-Sigma (KD1S) Modulator Switched Capacitor Delta Sigma Modulator providing multiple feedback paths, comprising a KD1S modulator, one or more offset clocks, a clock generator, analog circuitry, a baseband filter, a main path switched capacitor filter, and one or more output latches for one or more analog paths, wherein each path samples the data with the one or more offset clocks such that the equivalent sampling rate of the Delta Sigma Modulator is the number of paths multiplied by the base sampling rate of each path.

In one preferred embodiment, there is provided an improved KD1S Modulator wherein the one or more offset clocks are non-overlapping.

In another preferred embodiment, there is provided an improved KD1S Modulator where the Delta Sigma Modulator comprises a delta block of switched capacitors sequentially subtracting a plurality of N feedback paths in the KD1S modulator, N being an integer greater than 2, from the analog input to produce an analog output; wherein the effective sampling rate is Fs=N*Fs_base, wherein Fs_base is the base sampling rate.

In another preferred embodiment, there is provided an improved KD1S Modulator wherein N=8 and the base sampling rate is 5 GHz.

In another preferred embodiment, there is provided an improved KD1S Modulator wherein the clock generator has an input word that specifies a number of paths (M) to be disabled, and wherein the analog paths are adjusted for the disabled paths and the summing circuit for all paths.

In another preferred embodiment, there is provided an improved KD1S Modulator wherein the device is radiation hardened.

In another preferred embodiment, there is provided a method of saving power, utilizing the improved KD1S Modulator herein, in a component of a space communication device, wherein (a) a packet is received at a low bandwidth and (b) a receiver is adjusted to accommodate a higher rate.

In another preferred embodiment, there is provided a method of saving power, utilizing the improved KD1S Modulator herein, wherein one or more paths in a KD1S Analog to Digital Converter are disabled.

In another preferred embodiment, there is provided a method of saving power, utilizing the improved KD1S Modulator herein, wherein the sampled signals into the main path switched capacitor filter are automatically adjusted so that the disabled paths do not cause an offset or interference with the enabled paths.

In another preferred embodiment, there is provided a method of saving power, utilizing the improved KD1S Modulator herein, wherein the adjustment comprises the reset of the output latches for the disabled paths to ensure that no change occurs in the operating point of the output.

In another preferred embodiment, there is provided a method of saving power, utilizing the improved KD1S Modulator herein, wherein, based on the number of paths disabled, the bandwidth of the baseband filter is reduced to maintain a high effective number of bits.

In another preferred embodiment, there is provided a method of saving power, utilizing the improved KD1S Modulator herein, utilized in a space communication application.

DETAILED DESCRIPTION OF THE INVENTION

Figure 1:
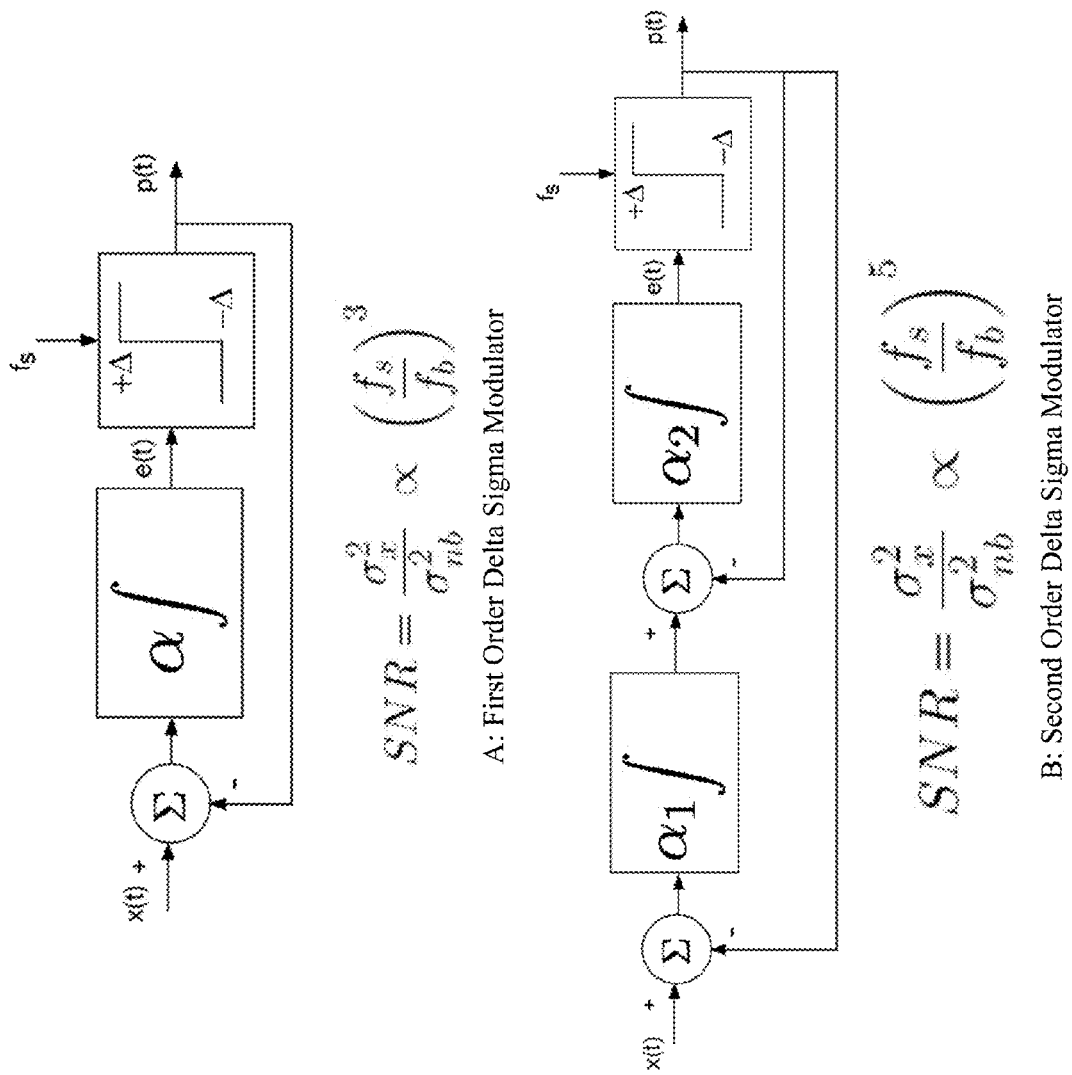
FIGS. 1A and 1B show block diagrams of a first order and second order Delta Sigma Modulator.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modification to the various disclosed embodiments may be made and other embodiments may be utilized, without departing from the spirit and scope of the present invention. The following detailed description is therefore, not to be taken in a limiting sense.

Both analog-to-digital converters (ADCs) and digital-to-analog converters (DACs) can employ delta-sigma modulation. A delta-sigma ADC first encodes an analog signal using high-frequency delta-sigma modulation, and then applies a digital filter to form a higher-resolution but lower sample-frequency digital output. On the other hand, a delta-sigma DAC encodes a high-resolution digital input signal into a lower-resolution but higher sample-frequency signal that is mapped to voltages, and then smoothed with an analog filter. In both cases, the temporary use of a lower-resolution signal simplifies circuit design and improves efficiency.

The coarsely-quantized output of a delta-sigma modulator is occasionally used directly in signal processing or as a representation for signal storage. For example, the Super Audio CD (SACD) stores the output of a delta-sigma modulator directly on a disk.

An analog signal is converted into a stream of pulses because it is very easy to regenerate pulses at the receiver into the ideal form transmitted. The only part of the transmitted waveform required at the receiver is the time at which the pulse occurred. Given the timing information the transmitted waveform can be reconstructed electronically with great precision. In contrast, without conversion to a pulse stream but simply transmitting the analog signal directly, all noise in the system is added to the analog signal, reducing its quality.

Each pulse is made up of a step up followed after a short interval by a step down. It is possible, even in the presence of electronic noise, to recover the timing of these steps and from that regenerate the transmitted pulse stream almost noiselessly. Then the accuracy of the transmission process reduces to the accuracy with which the transmitted pulse stream represents the input waveform.

Delta-sigma modulation is used because it converts the analog voltage into a pulse frequency and is alternatively known as Pulse Density modulation or Pulse Frequency modulation. In general, frequency may vary smoothly in infinitesimal steps, as may voltage, and both may serve as an analog of an infinitesimally varying physical variable such as acoustic pressure, light intensity, etc. The substitution of frequency for voltage is thus entirely natural and carries in its train the transmission advantages of a pulse stream. The different names for the modulation method are the result of pulse frequency modulation by different electronic implementations, which all produce similar transmitted waveforms.

The delta-sigma analog to digital conversion is used because the ADC converts the mean of an analog voltage into the mean of an analog pulse frequency and counts the pulses in a known interval so that the pulse count divided by the interval gives an accurate digital representation of the mean analog voltage during the interval. This interval can be chosen to give any desired resolution or accuracy. The method is cheaply produced by modern methods; and it is widely used.

High speed communications and complex systems are some of the benefits of the continued increase in transistor speeds that are available. However, increasing speed can result in decreased gain and increased transistor leakage.

K-Delta-1-Sigma (KD1S) modulation improves upon traditional Delta-Sigma modulation by employing inherent time-interleaving with a shared op-amp and K-quantizing paths. KD1S achieves significantly higher conversion bandwidths that traditional Delta-Sigma AD converters.

The K-Delta-1-Sigma topology employs averaging and parallelism. This results in both higher bandwidth and improved signal-to-noise ratio (SNR). This feature and its advantages distinguished the K-Delta-1-Sigma modulator from simple parallel converter arrangements. The K-Delta-1-Sigma Modulator has a number of interconnected blocks. In one aspect a delta block subtracts K feedback paths from the input signal. The designation "K" in this disclosure is a number of two or greater. For example, if K equals four, the delta block subtracts four feedback paths from the input signal. The output of the delta block is an analog signal called the analog output. Another block called the sigma block receives the analog output from the delta block and filters it in some way. Many types of filters are possible including single and multi-pole filters implemented as low pass, band pass, and high pass. An integrator can also be one of the sigma block types. In the K-Delta-1-Sigma Modulator, there is a single sigma block, hence the designation K-Delta-1-Sigma.

The output of the sigma block is called the filtered output. The filtered output is the time interleaved average of the input to the sigma block. The filtered output is received by K quantizers. A quantizer is a device that receives an analog input and produces a digital output. The digital output from each quantizer can be a single bit representing a one or zero. The digital output from each quantizer can also be a number of bits, depending upon the quantizer type. As a result, the K quantizers produce K digital outputs. Each of the K digital outputs feeds into a corresponding one of K digital-to-analog converters. The output of each of the K digital-to-analog converters is a feedback path introduced earlier. In total there are K feedback paths.

The K quantizers are clocked by individual phases of a main clock frequency fs. While each phase is the same frequency of the main clock, the active portion of each phase does not coincide with the active portions of the other phases, but rather they are shifted from adjacent phases by $1/(K*fs)$. The effective sampling rate of the topology is therefore K times fs. The result is a sampling rate of K times fs while all clocks are limited in frequency to fs. This reduces the design and manufacturing constraints on mixed-signal designs such as analog-to-digital converters (ADCs).

Further processing is available for the K digital outputs from the K quantizers. Such processing can be decimation, summation, scaling, truncation or digital filtering. Some embodiments may employ a digital multiplexer which sequentially switches the outputs of the K quantizers onto a single digital output. This embodiment provides a temporal sequence of ones and zeros that reflect the value of the analog input.

Some aspects of the topology allow the analog sections of the topology to operate at fs while the digital sections operate at higher speeds such as K times fs. This is advantageous because it is typically easier to design high speed digital systems than it is to design accurate, high speed analog systems. Additionally, lower clock speeds allow the use of larger, slower and less expensive semiconductor processes.

In one aspect the delta block is implemented by a switch capacitor network. The various phases of the clock alternately charge K capacitors to the value of a corresponding feedback path and then switch them to subtract that value from the input signal.

In some aspects a gain block or amplifier is interposed between the output of the sigma block and the inputs of the K quantizers. The amplifier or gain stage can provide voltage gain, current gain or both. Depending upon the signal paths employed in the K-Delta-1-Sigma Modulator, the amplifier or gain stage can be single ended or differential. This additional gain improves the topology's tolerance to offsets, response time and component variations. The amplifier or gain stage acts as a quantizer pre-amplifier. Since the speed of the quantizers can be a factor in the performance of the K-Delta-1-Sigma Modulator, the amplifier may improve performance in some applications.

In some aspects, delays are added to various clock phases to improve the overall operation and stability of the K-Delta-1-Sigma Modulator.

Appropriate delays, inserted in various phases of the clock, compensate for the speed of various K-Delta-1-Sigma Modulator components. Delays are useful for example when improving the operation of clocked quantizers or switch capacitor networks.

In other aspects, multiple K-Delta-1-Sigma stages can be cascaded for improved performance. Advantages include higher sampling rates and the ability to further randomize noise and avoid tones in the output spectrum. In addition to cascaded configurations, parallel configurations are also possible.

Analog to Digital Converters (ADCs) form the interface between the analog and digital domains in a communication system. The improved KD1S of the present invention finds utility in these applications. One preferred example of these interfaces include the Receiving and Transmitting path of an RF chain (1 MHz -25 MHz). Another preferred embodiment is the front-end for 10 Gb/s serial/optical links. Another preferred example is the use for Audio (44.1 kHz, 24 bits). Additionally, as industry standards and applications evolved, preferred embodiments are found in ultra wide band communications (UWB), Multiband WLAN, Software/Cognitive Radio (~1-10 GHz), as well as PAM signaling and equalization on serial/optical links (to 120 Gb/s). The use of CMOS scaling enables higher sampling speed but at the cost of component mismatches and reduced gain (non-linearity).

Referring now to the Figures, a block diagram of a first order and second order Delta Sigma Modulator are shown in FIGS. 1A and 1B. Basically a Delta Sigma Modulator, attempts to force a digital representation at the output of the 1-bit quantizer, sampled at the rate fs, to "represent" the analog signal. Consider that a DC (or very low frequencies) the gain of the integrator is infinite or very large decreasing as the signal frequency increases. At the very large gains the quantization noise of the 1-bit quantizer are suppressed but increase as the gain decrease. Essentially, the Delta Sigma Modulator moves the quantization noise out of band to the higher frequencies. By digitally filtering the high rate digital stream, we can recover the analog signal in a digital format.

The effective number of bits (ENOB) is related to the oversampling ratio and the order of the modulator. Non-idealities in an actual analog implementation degrade the SNR. The Signal to Noise Ratio (SNR) of the first order and second order modulator are related to the ratio of the sampling rate and signal bandwidth (the SNR has a complex relationship with the signal level and type of signal, e.g. sinusoidal or DC). Clearly, the second order modulator achieves a much higher SNR compared to the first order modulator. However, by going to a third order modulator, to achieve a higher SNR, the designer will encounter stability problems.

Figure 2:
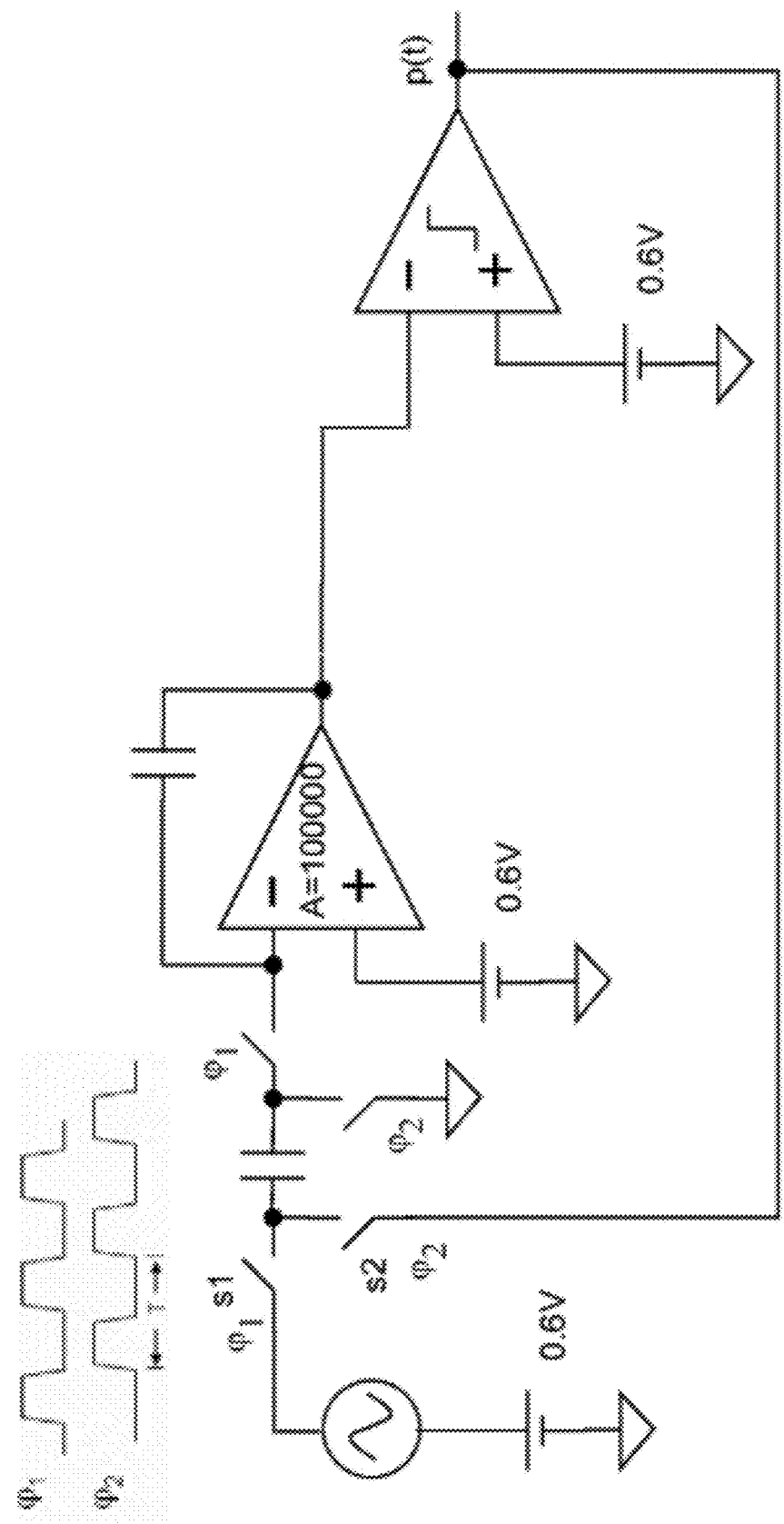
FIG. 2 shows a single ended switched capacitor implementation of a 1st order Delta Sigma Modulator.
Figure 3:
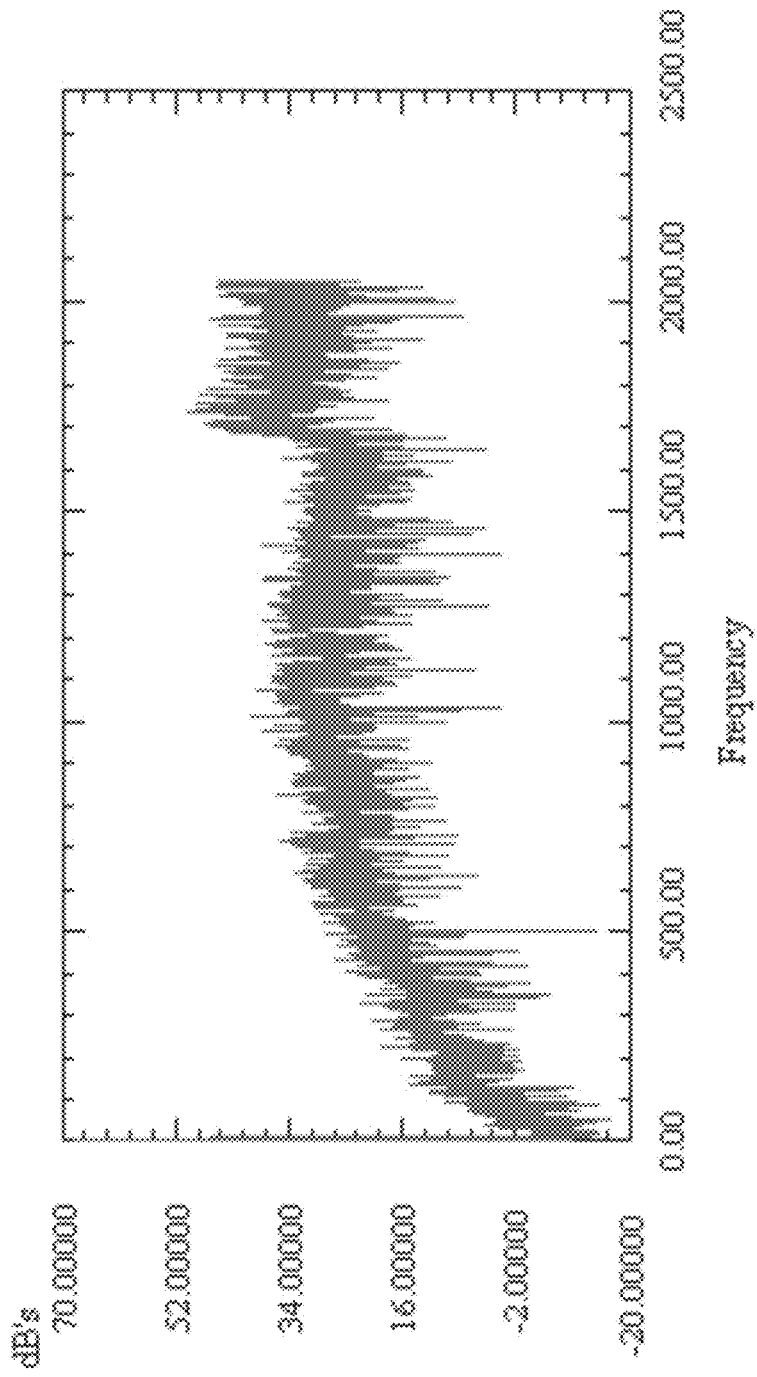
FIG. 3 shows a graph plotting decibels against Frequency for a Switched Capacitor 1st Order DSM Spectrum (frequency in samples, max fs/2).

A single ended switched capacitor implementation of a 1st order Delta Sigma Modulator is shown in FIG. 2. The design uses a 1.2v supply. Note the noise shaping of the Delta Sigma Modulator.

In one embodiment, the invention achieves GHz Sampling Rates with 90 nm CMOS. Currently, the very high bandwidth in some recent Delta Sigma modulation circuits are achieved with SiGe BiCMOS. However, we have been able to harden 90 nm and 65 nm CMOS using RHBD techniques and have taped out mixed signal circuits and tested them in silicon. The devices have also been radiation tested.

The terms 90 nm CMOS and 45 nm CMOS may refer to the transistor gate length. In advanced CMOS technologies, these numbers may refer to ½ the contacted pitch of the DRAM, which is also ½ the pitch of the first level of metallization. Pitch refers to the distance between adjacent metal bit lines or polysilicon/flash poly. Thus, it may be close to the printed gate length of the transistors, but not necessarily identical. The International Technology Roadmap for Semiconductors (ITRC) Executive Summary, e.g. 2011, is referenced and incorporated herein in its entirety for additional information. It is contemplated as within the scope of the present invention to include exemplary 45 nm CMOS process such as Intel's 45 nm process described in the Intel Technology Journal Q2'08 (Vol. 12, Issue 2) and that of American Semiconductor, Inc. of Boise, Id.

Since Delta Sigma Modulators require very high speed digital filtering of the high rate pulses prior to decimation and also require digital low pass filtering to recover the digital samples, it lends itself very well to the downward scaling of CMOS geometries where both higher speeds and higher transistor densities are achieved.

Figure 4:
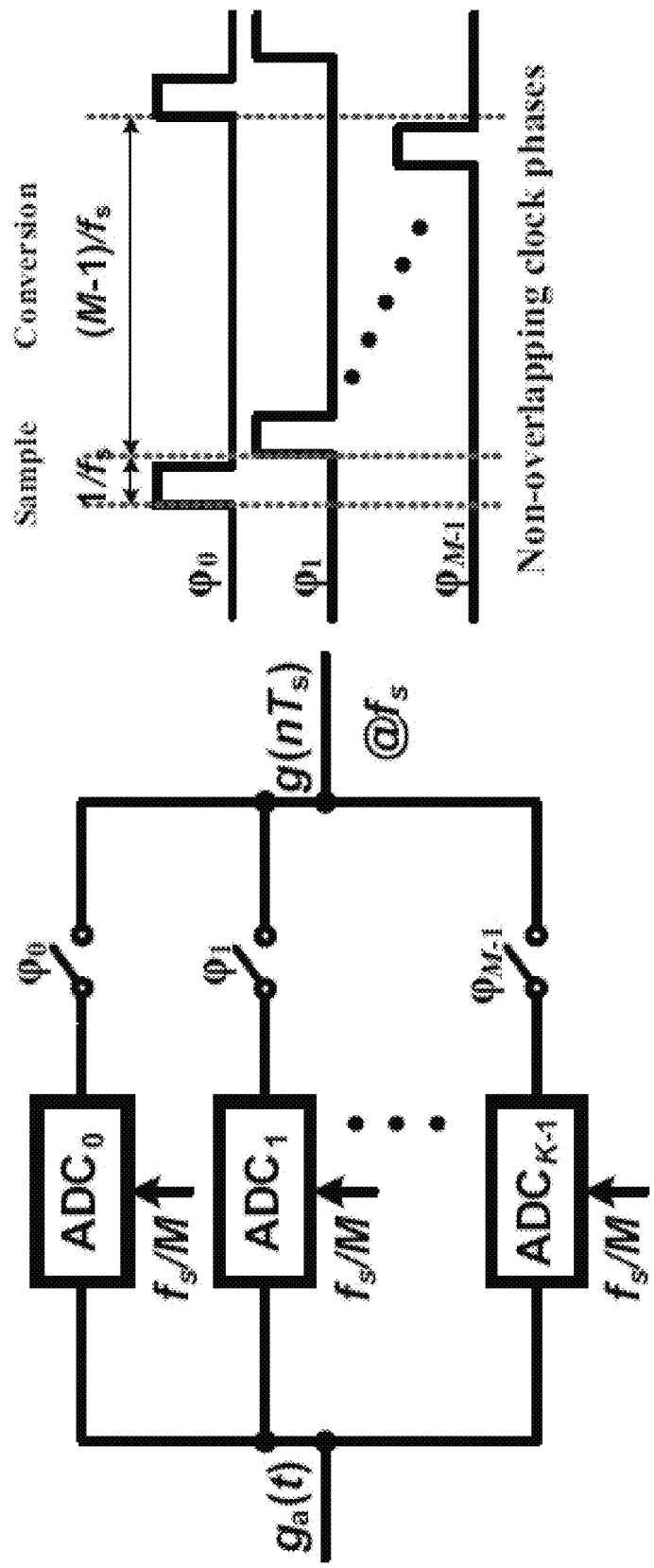
FIG. 4 shows Delta Sigma Modulation Architectures that achieve a high oversampling ratio using time-interleaved ADCs.
Figure 5:
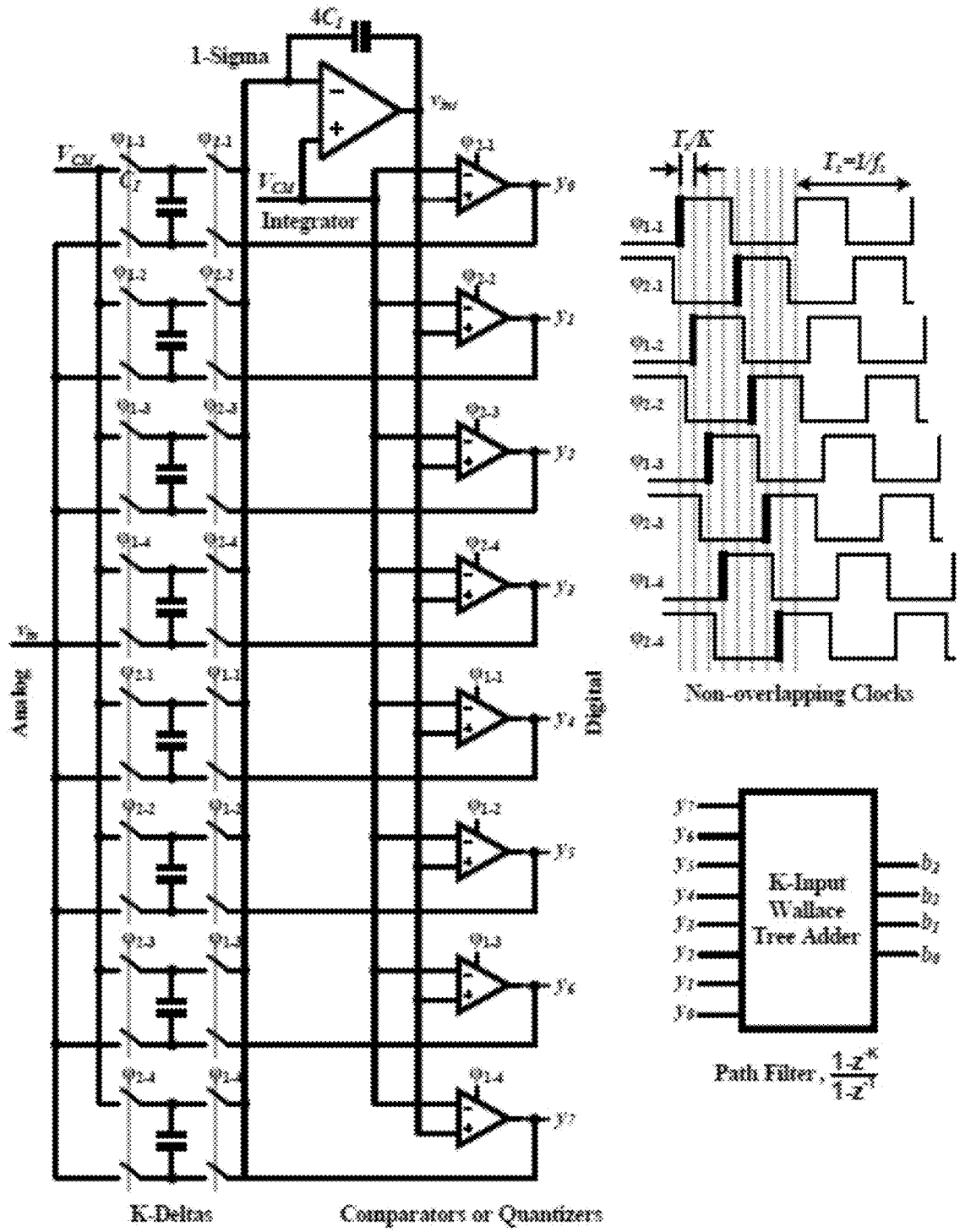
FIG. 5 shows a Switched Capacitor 8 Path KD1S Modulator.

Provided herein are DSMs that achieve multi GHz sampling rates with 90 nm and 45 nm CMOS processes. To overcome the fact that at these technology nodes fr is lower than SiGe BiCMOS, we take advantage of Delta Sigma Modulation Architectures that achieve a high oversampling ratio using time-interleaved ADCs as shown in FIG. 4, and Parallel Delta Sigma Architectures. In FIG. 4, each ADC is sampled at 1/M the final sampling rate fs. Thus, even though at the particular technology node, the individual ADC is designed with a maximum sampling rate fs/M, the overall rate is fs. Note that there are many tradeoffs and circuit non-idealities that limit the performance of these architectures. One preferred architecture to achieve multi-GHz sampling rates is the K-Delta-1-Sigma Modulators [Saxena, 2010], [Baker, 2009]. In this design time interleaving is used in a novel way such a shared integrator operating at the base sampling rate. A Switched Capacitor 8 Path KD1S Modulator is shown in FIG. 5.

Figure 6:
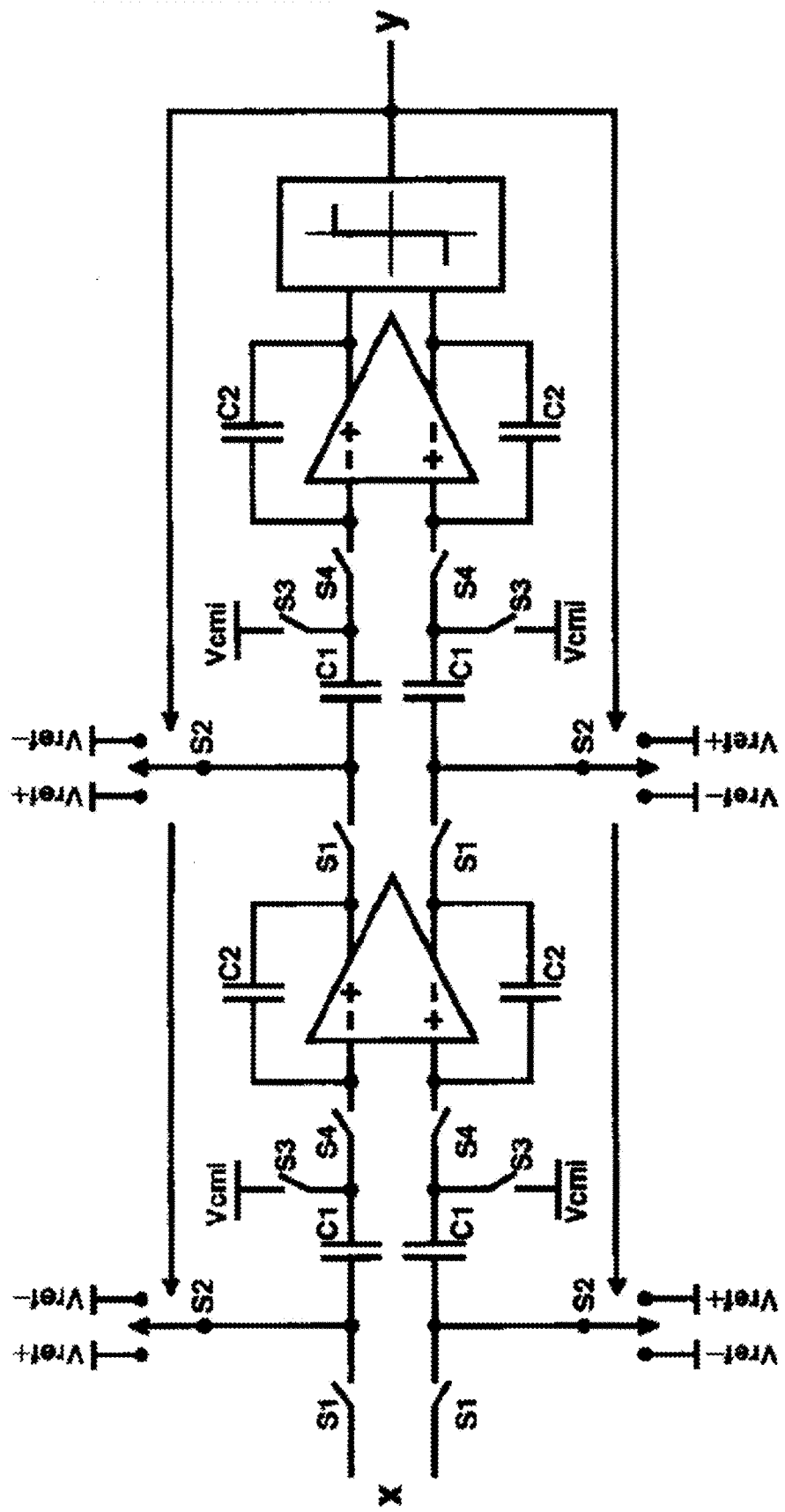
FIG. 6 shows a fully differential CMOS implementation of a second-order switched capacitor Delta Sigma Modulator.

In designing the Delta Sigma Modulators herein, we achieve very high sampling rates using both fully differential CMOS switched capacitor Delta Sigma Modulators[Brandt, 1991] shown in FIG. 6, and Continuous Time (CT) Delta Sigma Modulators.

To obtain very high sampling rates in Delta Sigma Modulators, parallel and interleaving architectures are required. The K Delta 1 Sigma (KD1S) Switched Capacitor Delta Sigma Modulator provides multiple paths where each path samples the data with offset clocks such that the equivalent sampling rate of the Delta Sigma Modulator is the number of paths multiplied by the base sampling rate of each path. By designating the number of paths in a KD1S modulator at N, the effective sampling rate is Fs=N*Fs_base where Fs_base is the base sampling rate. Therefore, to obtain a sampling rate of 40 GHz to meet bandwidth and resolution requirements, 8 Paths are used with a base sampling rate of 5 GHz. In this case N=8.An advantage of the KD1S modulator is that N paths each running at 5 GHz sampling rate reduce power versus running at 40 GHz (power is proportional to clocking frequency). With these improvements, we provide the capability to balance performance with power in many applications. So when high performance is needed (e.g. high bandwidth) all paths are activated. When low performance is required, we reduce the effective bandwidth by shutting down multiple paths. We also adjust the baseband filtering for lower bandwidth. This results in a large saving in power consumption. This scenario is frequently encountered in digital communication where a lower bandwidth is used for beacons and once a rate is negotiated, the higher performance higher bandwidth rates are activated by enabling the extra paths.

In space communication applications, saving power consumption while maintaining the communication link is a great advantage. When a packet is received at a low bandwidth, the receiver adjusts to accommodate a higher rate. At the initial lower rate, we save power by turning off paths in a KD1S Analog to Digital Converter. When a higher rate is required, multiple paths are enabled in the KD1S to accommodate the higher band widths. Over time, a substantial amount of energy is saved. For example, at the very high rate the ADC alone may consume 4 Watts. In low bandwidth initial mode (waiting for a beacon or just a packet at the low rate), the power can be reduced to less than a 100 mW. This is especially true on the receive side where it is always active.

Also provided in a preferred aspect is the capability to increase or decrease the number of active paths in a K Delta 1 Sigma Modulator based on the bandwidth or resolution required. Power consumption can thereby be traded off against bandwidth (hence, data rate) or resolution.

B: To reduce the number of paths in a multi-path KD1S modulator, the phases of the clock generator that was originally designed for N paths have to adjusted for M<N paths. Therefore, the complexity of the clock generation circuit including adjustable delays and pulse widths are added to the design. This complexity, however, does not add a power penalty. Eliminating a path which is clocked at the base sampling frequency, fs_base, has a substantial impact on power reduction. Furthermore, for each path that is disabled, besided the adjustments on the enable path clocks, the sampled signals into the main path switched capacitor filter must be set such that the common mode voltage, equivalent to a zero non-interfering signal must be redesigned so that the disabled path does not cause an offset or interference with the enabled paths. The output latches for the disabled paths must be reset so that the, for example high speed Wallace tree, does not change the operating point of the 3 bit output. When M paths where M<N are disabled, the effective sampling rate is reduced. This results in a degradation in the effective number of bits after decimation and baseband filtering. In some applications this is not an issue as the lower rate mode can tolerate a lower SNR. However, in sensor applications, we tradeoff power for bandwidth but need to maintain the accuracy of the conversion. In this case, based on the number of paths disabled, the bandwidth of the baseband filter is reduced to maintain a high effective number of bits.

C: In this innovation, the clock generator with the added complexity has an input word that specifies M the number of paths to be disabled. Based on the input word M the analog paths is adjusted for the disabled paths as well as the summing circuit for all paths. This invention herein provides the capability to increase or decrease the number of active paths in a K Delta 1 Sigma Modulator based on the bandwidth or resolution required for a sensor or communication application. The enabling or disabling of paths requires a rework and adjustment of the non-overlapping multiple clocks used in the KD1S modulator. The phase and widths are adjusted. Also analog circuitry is added to null out the path even though the clocks have been shut down for the path. The summing node is adjusted to null out disabled paths. Finally, the baseband filter is adjusted for a narrower bandwidth to account for the reduced rate in order to maintain resolution or accept the reduction of effective bits for a fixed bandwidth. Accordingly, with these changes to the architecture of a KD1S modulator, one of the advantages is that of a longer battery life over extended periods where the receiver is waiting for a packet or a high rate link to be established.

Figure 7:
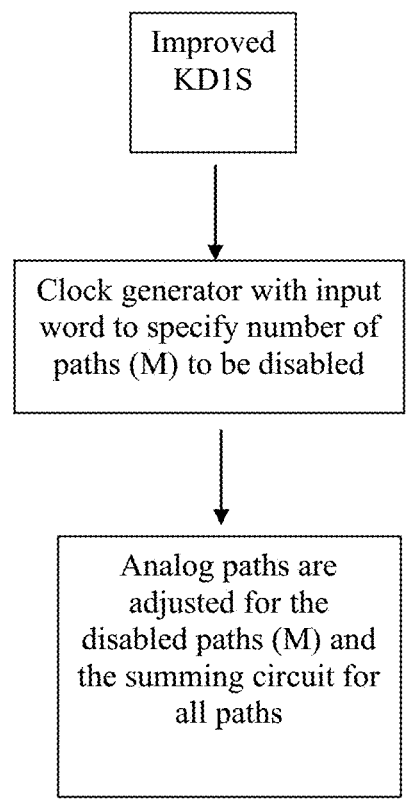
FIG. 7 shows a diagram of one exemplary embodiment of an improved KD1S modulator having a clock generator that provides an input word to specify the number of paths to be disabled.

FIG. 7 shows a diagram of one exemplary embodiment of an improved KD1S modulator having a clock generator that provides an input word to specify the number of paths to be disabled, resulting in the adjustment of the analog paths and the summing circuit for all paths.

Figure 8:
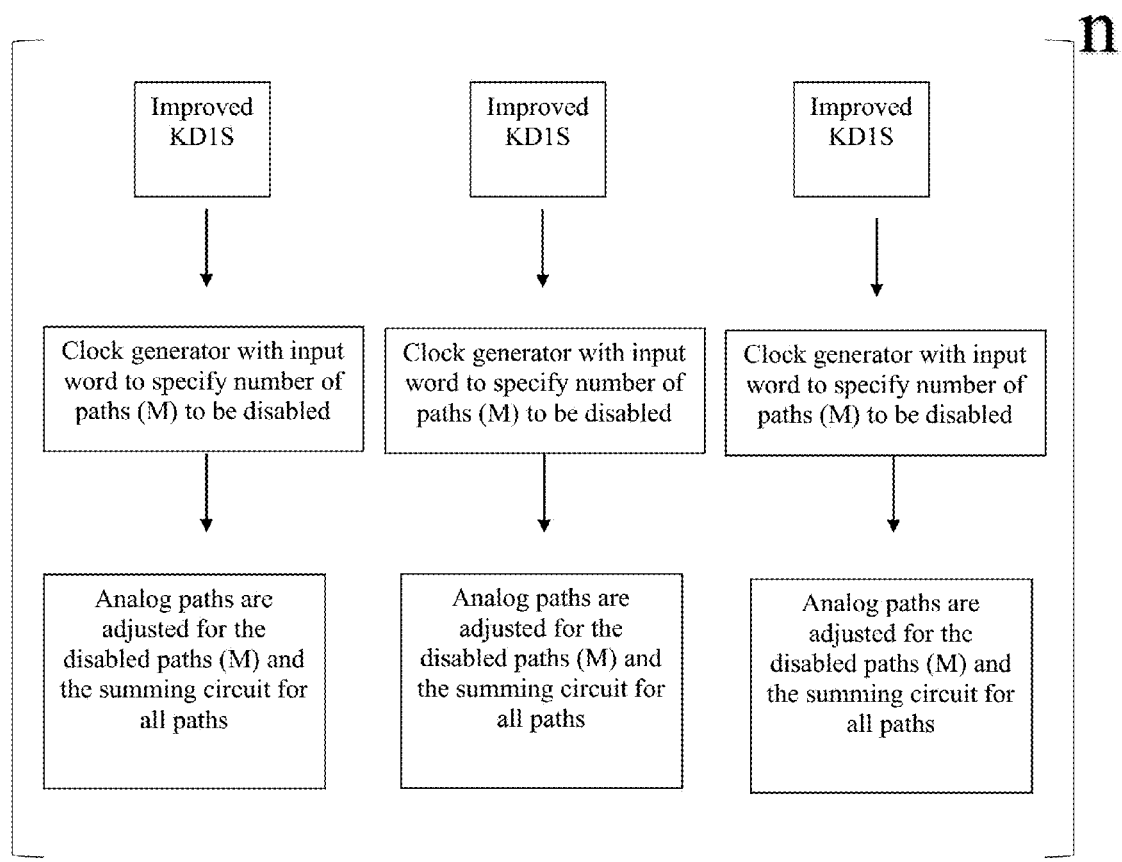
FIG. 8 shows a diagram of an example of a radiation hardened improved KD1S modulator. The topology can include [n+1] modulators where n>1.

FIG. 8 shows a diagram of an example of a radiation hardened improved KD1S modulator. FIG. 8 shows how the topology is repeated within the circuit, and which may be physically separated such that no single event upset or a single impact of a multi-event upset, is able to knock out all of the "n" KD1S modulators in one event. The topology can include [n+1] modulators where n>1.

Figure 9:
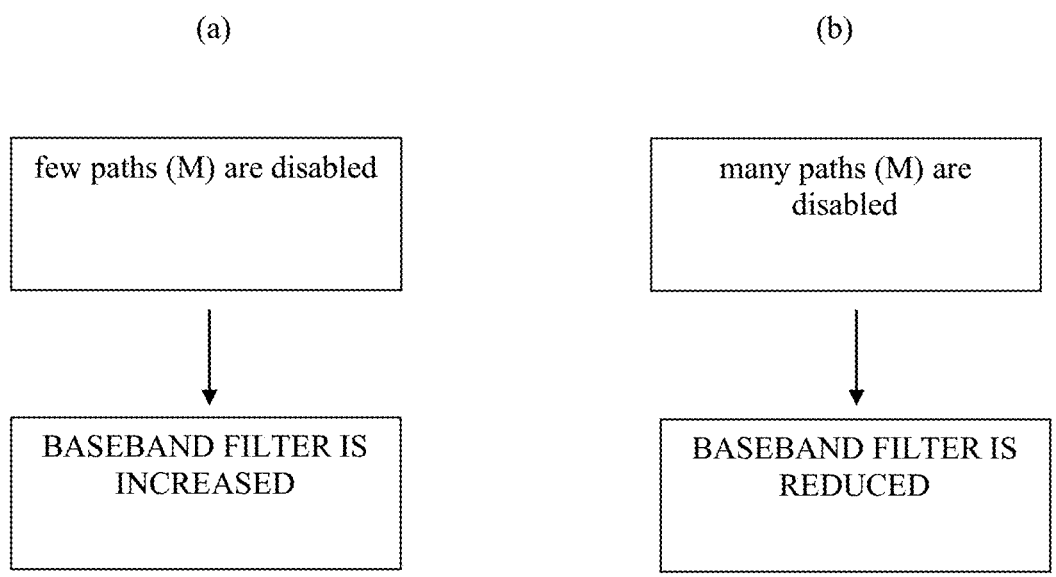
FIG. 9 shows a diagram wherein the baseband filter is modified (increased or reduced) depending on the number of paths that are disabled.

FIG. 9 shows a diagram wherein the baseband filter is modified (increased or reduced) depending on the number of paths that are disabled. This energy saving adaptation is critical in, e.g. space applications.

REFERENCES

Each cited document is incorporated by reference herein, in its entirety.

Agarwal, V. Birkar, S., "Comparison of Gamma Radiation Performance of a Range of CMOS A/D Converters Under Biased Conditions"' *IEEE Transactions on Nuclear Science*, VOL. 52, NO. 6, December 2005 3059.

Allstot, D. J. ; Liang, G. ; Yang, H. C., "Current-mode logic techniques for CMOS mixed-mode ASICs," *Proceedings of the IEEE Custom Integrated Circuits Conference*, 1991.

Amaral, P.; Goes, J.; Paulino, N.; Steiger-Garcao, A.,"An improved low-voltage low-power CMOS comparator to be used in high-speed pipeline ADCs," 2002 *IEEE International Symposium on Circuits and Systems*.

Anderson, M., Sundstrom, L., "A 312-MHz CT DS modulator using a SC feedback DAC with reduced peak current," 33rd *European Solid State Circuits Conference*, 2007.ESSCIRC 2007.

Ardalan, S.; Paulos, J., "An analysis of nonlinear behavior in delta-sigma modulators," *IEEE Transactions on Circuits and Systems*, Volume 34, Issue 6, June 1987 Page(s):593-603.

Ardalan, S., Burke, W., Mavis, D., Eaton P., "Experimental Characterization of SEE of CMOS 90 nm PLL for the Identification of Dominant Response Circuits", *Nineteenth Annual Single-Event Effects* (SEE) *Symposium*, San Diego, Calif., April 2010.

Altun, O., Jinseok Koh, Allen, P. E., "A 1.5V multirate multibit sigma delta modulator for GSM/WCDMA in a 90 nm digital CMOS process," *IEEE International Symposium on Circuits and Systems*, 2005.ISCAS 2005.Page(s): 5577-5580 Vol. 6.

Baker, R. J., "K-Delta-1-Sigma Modulator," U.S. Pat. No. 12/436,778, 2009.

Baker R. Jacob, Vishal Saxena, "Design of Bandpass Delta-Sigma Modulators: Avoiding Common Mistakes," Department of Electrical and Computer Engineering Boise State University, 2007.

Baker, R. J., "CMOS Mixed-Signal Circuit Design, Second Edition," Wiley-IEEE Press, 2009.ISBN 978-0-470-29026-2.

Bazes, Mel, "Two Novel Fully Complementary Self-Biased CMOS Differential Amplifiers," *EEE Journal Of Solid-State Circuits*, VOL. 26, NO. 2, February 1991.

Brandt, B. P.; Wingard, D. E.; Wooley, B. A., "Second-order sigma-delta modulation for digital-audio signal acquisition," *IEEE Journal of Solid-State Circuits*, Volume: 26 Issue: 4 Date: April 1991.

Chalvatzis, T. Gagnon, E. Repeta, M. Voinigescu, S. P., "A Low-Noise 40-GS/s Continuous-Time Bandpass Delta Sigma ADC Centered at 2 GHz for Direct Sampling Receivers," *IEEE Journal of Solid-State Circuits*, Page(s): 1065-1075, Volume: 42 Issue: 5 Date: May 2007.

Cortes, F. P., Carro, L., Girardi, A., Suzim, A., "A Sigma Delta A/D converter insensitive to SEU effects," *Proceedings of the Eighth IEEE International On-Line Testing Workshop*, 2002.

Eguchi, K., Chibashi, M., Waho, T., "A design of 10-GHz delta-sigma modulator using a 4-level differential resonant-tunneling quantizer," *Proceedings* 35*th International Symposium on Multiple-Valued Logic*, 2005.Page(s): 43-47.

Erbar, M., Rieger, M., Schemmann, H., "A 1.28-GHz sigma-delta modulator for video A/D-conversion," *IEEE Transactions on Consumer Electronics*, Page(s): 357-361, Volume: 42 Issue: 3 Date: August 1996.

Eshraghi, A. and Fiez, T., "A Comparative Analysis of Parallel Delta-Sigma ADC Architectures," IEEE Transactions on Circuits and Systems I: Regular Papers, vol. 51, no. 3, pp. 450:458, 2004.

Fakhoury, H., Jabbour, C., Khushk, H., Van Tam Nguyen, Loumeau, P., "A 65 nm CMOS EDGE/UMTS/WLAN tri-mode four-channel time-interleaved Delta Sigma ADC,"

Joint IEEE North-East Workshop on Circuits and Systems and TAISA Conference, 2009.NEWCAS-TAISA '09.Page(s): 1-4.

Hart, A., Voinigescu, S. P., "A 1 GHz Bandwidth Low-Pass\Delta\Sigma ADC With 20-50 GHz Adjustable Sampling Rate'" *IEEE Journal of Solid-State Circuits*, Page(s): 1401-1414 Volume: 44 Issue: 5 Date: May 2009.

Heydari, Payam, and Ravindran Mohanavelu,"Design of Ultrahigh-Speed Low-Voltage CMOS CML Buffers and Latches," *IEEE Transactions On Very Large Scale Integration (VLSI) Systems*, VOL. 12, NO. 10, October 2004.

Jensen, J. F., Raghavan, G., Cosand, A. E., Walden, R. H., "A 3.2-GHz second-order delta-sigma modulator implemented in InP HBT technology," *IEEE Journal of Solid-State Circuits*, pp. 1119-1127 Vol. 30 Issue: 10, October 1995.

Jouidal, Nejmeddine, Chiheb Rebail, Adel Ghazell and Dominique Dallet, "Comparative Study between Continuous-Time Real and Quadrature Bandpass Delta Sigma Modulator for Multistandard Radio Receiver," *Instrumentation and Measurement Technology Conference-IMTC 2007*, Warsaw, Poland, May 1-3, 2007.

Jiang Yu, Maloberti, F., "A low-power multi-bit Delta Sigma Modulator in 90-nm digital CMOS without DEM," *IEEE Journal of Solid-State Circuits*, Pages: 2428-2436 Volume: 40 Issue: 12 Dec. 2005.

Kuskie, C., Zhang, B., Schreier, R., "A decimation filter architecture for GHz delta-sigma modulators'" 1995 *IEEE International Symposium on Circuits and Systems*, 1995.ISCAS '95., Page(s): 953-956 Volume: 2.

Lee, Tsung-Sum, Wen-Bin Lin, and Dung-Lin Lee, "Design Techniques for CMOS Micropower Low-VoltageSwitched-Capacitor Delta-Sigma Modulator," 2004 IEEE Asia-Pacific Conference on Advanced System Integrated Circuits (AP-ASIC2004) Aug. 4-5, 2004.

Madoglio, P., Ravi, A., Cuellar, L., Pellerano, S., Seddighrad, P., Lomeli, I., Palaskas, Y., "A 2.5-GHz, 6.9-mW, 45-nm-LP CMOS, DS Modulator Based on Standard Cell Design With Time-Interleaving," *IEEE Journal of Solid-State Circuits*, Page(s): 1410-1420 Volume: 45 Issue: 7 Date: July 2010.

Mavis, D., et. al. "New Test and Analysis Approaches for SEE Characterization," *GOMACTech*-10, 24 March 2010.

Mavis, D. G. and Eaton, P. H., "Temporally Redundant Latch for Preventing Single Event Disruptions in Sequential Integrated Circuits", U.S. Pat. No. 6,127,864, October 2000.

Mavis, D. G. and Eaton, P. H., "SEU and SET Modeling and Mitigation in Deep Submicron Technologies", *Proceedings of the International Reliability Symposium (IRPS)* pp. 293-305, 2007.

Moon, U., G. Temes, E. Bidari, M. Keskin, L. Wu, J. Steensgaard, F. Maloberti, "Switched-Capacitor Circuit Techniques in Submicron Low-Voltage CMOS," IEEE 6th International Conference on VLSI and CAD, ICVC 1999.

Muhammad, K., Elahi, I., Jung, T., "A low-area decimation filter for ultra-high speed 1-bit Sigma-Delta A/D converters," *Proceedings of the IEEE* 2005 *Custom Integrated Circuits Conference*, 2005.

Murmann, B., "ADC Performance Survey, 1997-2008," [Online]. Available: http://www.stanford.edu/~murmann/adcsurvey.html.

Nakagome, Y. et al., "Experimental 1.5V 64 Mb DRAM," *IEEE Solid-state Circuits*, vol. 26, no. 4, pp. 465-472, April 1991.

Poornima Raikwar, Preeti Trivedi, Jaya Dipti Lal, "Analysis of Timing Error Aperture Jitter on the Performance of Sigma Delta ADC for Software Radio Mobile Receivers" International Conference on Advances in Recent Technologies in Communication and Computing, 2009.

Ryckaert, J., Borremans, J., Verbruggen, B., Van Driessche, J., Van der Perre, L., Craninckx, J., Van der Plas, G., "A 2.4 GHz 40 mW 40 dB SNDR/62 dB SFDR 60 MHz bandwidth mirrored-image RF bandpass Delta-Sigma ADC in 90 nm CMOS," *IEEE Asian Solid-State Circuits Conference*, 2008.A-SSCC '08.

Saxena, Vishal, "K-Delta-1-Sigma Modulators for Wideband Analog-to-Digital Conversion," Ph.D. Disseration, Boise State University, May 2010

Saxena, V. and Baker, R. J., "*Synthesis of Higher-Order K-Delta-1-Sigma Modulators for Wideband ADCs*," *Proceedings of the 53rd Midwest Symposium on Circuits and Systems*, Aug. 1-4, 2010.

Saxena, V., "K-Delta-1-Sigma Modulators For Wideband Analog-TO-Digital Conversion," Ph.D. Dissertation, Boise State University, May 2010.

Scholvin, J., Greenberg, D. R., del Alamo, J. A., "RF power potential of 90 nm CMOS: device options, performance, and reliability," IEEE International Electron Devices Meeting, 2004.IEDM Technical Digest.

Schreier, R., M. Snelgrove, "Bandpass Sigma-Delta Modulation", Aug. 30, 1989.

Schoofs, R., Steyaert, M., Sansen, W., "A 1 GHz continuous-time sigma-delta A/D converter in 90 nm standard CMOS," *IEEE MTT-S International Microwave Symposium Digest*, 2005.

Seddighrad, P., Ravi, A., Sajadieh, M., Lakdawala, H., Soumyanath, K., "A 3.6 GHz, 16 mW Delta-Sigma DAC for a 802.11n/802.16e transmitter with 30 dB digital power control in 90 nm CMOS," 34*th European Solid-State Circuits Conference*, 2008.ESSCIRC 2008.

Singor, F. W.; Snelgrove, W. M.,"Switched-capacitor bandpass delta-sigma A/D modulation at 10.7 MHz," *IEEE Journal of Solid-State Circuits*, March 1995, Volume: 30 Issue:3.

Thandri, B. K.; Martinez, J. S.,"*A 3.8 Gs/s, 75 mW, 10 bit continuous time bandpass ΣΔ ADC in 0.25 μm SiGe BiCMOS technology,*" 49*th IEEE International Midwest Symposium on Circuits and Systems*, 2006. MWSCAS '06.Page(s): 669-673 Volume: 2.

Turflinger, T. L. Davey, M. V. Bings, J. P., "Radiation effects in analog CMOS analog-to-digital converters," *IEEE Radiation Effects Data Workshop*, 1996.

Xiangtao Li, Kuo, W.-M. L. Cressler, J. D., Yuan Lu, "*A 20 GS/sec Analog-to-Digital Sigma-Delta Modulator in SiGe HBT Technology,*" *IEEE Custom Integrated Circuits Conference*, 2006. CICC '06.

Yong Lian, Ying Wei, Chandrasekaran, R., "A 1 GHz decimation filter for Sigma-Delta ADC," 50*th Midwest Symposium on Circuits and Systems*, 2007.MWSCAS 2007, Page(s): 401-404.

Yi-Jan Emery Chen, Kai-Hong Wang, Tang-Nian Luo, and Shuen-Yin Bai, Deukhyoun Heo, "Investigation of CMOS Technology for 60-GHz Applications," IEEE SoutheastCon, 2005 proceedings. 8-10 Apr. 2005.

en.wikipedia.org/wiki/Delta_sigma_modulator.

Although this invention has been described in terms of certain embodiments, other embodiments that are apparent to those of ordinary skill in the art, including embodiments that do not provide all of the features and advantages set forth herein, are also within the scope of this invention. Rather, the scope of the present invention is defined only by reference to the appended claims and equivalents thereof.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

I claim:

1. A K-Delta-1-Sigma (KD1S) Modulator Switched Capacitor Delta Sigma Modulator providing multiple feedback paths, comprising a KD1S modulator, one or more offset clocks, a clock generator, analog circuitry, a baseband filter, a main path switched capacitor filter, and one or more output latches for one or more analog paths, wherein each path samples the data with the one or more offset clocks such that the equivalent sampling rate of the Delta Sigma Modulator is the number of paths multiplied by the base sampling rate of each path, wherein the clock generator has an input word that specifies a number of paths (M) to be disabled, and wherein the analog paths are adjusted for the disabled paths and the summing circuit for all paths.

2. The Delta Sigma Modulator of claim 1, wherein the one or more offset clocks are non-overlapping.

3. The Delta Sigma Modulator of claim 2, wherein N=8 and the base sampling rate is 5 GHz.

4. The Delta Sigma Modulator of claim 1, such Delta Sigma Modulator comprising a delta block of switched capacitors sequentially subtracting a plurality of N feedback paths in the KD1S modulator, N being an integer greater than 2, from the analog input to produce an analog output; wherein the effective sampling rate is $Fs=N*Fs\_base$, wherein $Fs\_base$ is the base sampling rate.

5. The Delta Sigma Modulator of claim 1, further comprising wherein the device is radiation hardened.

6. A method of saving power, utilizing the Delta Sigma Modulator of claim 1, is a component of a space communication device, wherein (a) a packet is received at a low bandwidth and (b) a receiver is adjusted to accommodate a higher rate.

7. The method claim 6, wherein one or more paths in a KD1S Analog to Digital Converter are disabled.

8. The method of claim 7, wherein the sampled signals into the main path switched capacitor filter are automatically adjusted so that the disabled paths do not cause an offset or interference with the enabled paths.

9. The method of claim 7, wherein the adjustment comprises the reset of the output latches for the disabled paths to ensure that no change occurs in the operating point of the output.

10. The method of claim 6, wherein, based on the number of paths disabled, the bandwidth of the baseband filter is reduced to maintain a high effective number of bits.

11. The method of claim 6, utilized in a space communication application.

* * * * *